(12) United States Patent
Ohsawa

(10) Patent No.: US 6,538,916 B2
(45) Date of Patent: Mar. 25, 2003

(54) SEMICONDUCTOR MEMORY DEVICE

(75) Inventor: Takashi Ohsawa, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/963,681

(22) Filed: Sep. 27, 2001

(65) Prior Publication Data

US 2002/0110018 A1 Aug. 15, 2002

(30) Foreign Application Priority Data

Feb. 15, 2001 (JP) .......................................... 2001-039122

(51) Int. Cl.[7] .............................................. G11C 11/24
(52) U.S. Cl. ........................... 365/149; 257/347; 257/67
(58) Field of Search .......................... 365/149; 257/347, 257/67, 192, 194

(56) References Cited

U.S. PATENT DOCUMENTS 5,886,385 A * 3/1999 Arisumi et al. ............. 257/347

FOREIGN PATENT DOCUMENTS

JP            03-171768         7/1991

OTHER PUBLICATIONS

J. Leiss et al., "dRAM Design Using the Taper–Isolated Dynamic RAM Cell", IEEE Transactions on Electron Device, vol. ED–29, No. 4, Apr. 1982, pp. 707–714.
M. Tack et al., "The Multistabel Charge–Controlled Memory Effect in SOI MOS Transistors at Low Temperatures", IEEE Transactions on Electron Devices, vol. 37, No. 5, May 1990, pp. 1373–1382.
H. Wann et al., "A Capacitorless DRAM Cell on SOI Substrate", IEDM 1993, pp. 635–638.

* cited by examiner

Primary Examiner—Vu A. Le
(74) Attorney, Agent, or Firm—Banner & Witcoff, Ltd.

(57) ABSTRACT

A semiconductor memory device has MIS transistors to constitute a memory cell array. Each of the MIS transistors has a silicon layer in a floating state. Furthermore, the MIS transistor has a second gate, a potential of which is fixed in order to control a potential of the silicon layer by a capacitive coupling, in addition to a first gate, which forms a channel between a source region and a drain region of the MIS transistor. The MIS transistor dynamically stores a first data state in which the silicon layer has a first potential set by impact ionization generated near a drain junction and a second data state in which the silicon layer has a second potential set by a forward current flowing through the drain junction.

19 Claims, 19 Drawing Sheets

"0"read/"1"write

SEMICONDUCTOR MEMORY DEVICE

CROSS REFERENCE TO RELATED APPLICATION

This application claims the benefit of priority under 35 U.S.C. §119 to Japanese Patent Application No. 2001-39122 filed on Feb. 15, 2001, the entire contents of which are incorporated by reference herein.

BACKGROUND OF THE INVENTION

1. Field of the Invention

The present invention relates to a semiconductor memory device which dynamically stores data with using a channel body of a transistor as a storage node.

2. Related Background Art

In a related DRAM, a memory cell is composed of an MOS transistor and a capacitor. The scale-down of the DRAM has been remarkably advanced by the adoption of a trench capacitor structure and a stacked capacitor structure. At present, the cell size of a unit memory cell is scaled down to an area of 2 F×4 F=8 $F^2$, where F is a minimum feature size. Namely, the minimum feature size F decreases with the advance of generation, and when the cell size is generally taken to be $\alpha F^2$, a coefficient $\alpha$ also decreases with the advance of generation. Thus, at the present of F=0.18 $\mu$m, $\alpha$=8 is realized.

In order to hereafter secure the trend of cell size or chip size which is the same as before, it is demanded to satisfy $\alpha$<8 in F<0.18 $\mu$m and further satisfy $\alpha$<6 in F<0.13 $\mu$m, and together with microfabrication, the formation of cell size of the possible small area becomes a large problem. Accordingly, various proposals for decreasing the size of the one memory cell with the one transistor and one capacitor to $6F^2$ or $4F^2$ are made. However, practical use is not easy since there are a technical difficulty that the transistor has to be a vertical type, a problem that electric interference between adjacent memory cells increases, and in addition difficulties in terms of manufacturing technology including fabrication, film formation, and the like.

On the other hand, some proposals for a DRAM in which a memory cell is composed of one transistor without using a capacitor are made as mentioned below.
(1) JOHN E. LEISS et al, "dRAM Design Using the Taper-Isolated Dynamic Cell" (IEEE TRANSACTIONS ON ELECTRON DEVICES, VOL. ED-29, NO. 4, APRIL 1982, pp707–714)
(2) Japanese Patent Laid-open Publication No. H3-171768
(3) Marnix R. Tack et al, "The Multistable Charge-Controlled Memory Effect in SOI MOS Transistors at Low Temperatures" (IEEE TRANSACTIONS ON ELECTRON DEVICES, VOL, 37, MAY, 1990, pp1373–1382)
(4) Hsing-jen Wann et al, "A Capacitorless DRAM Cell on SOI Substrate" (IEDM93, pp635–638)

A memory cell in the document (1) is composed of MOS transistors, each of which has a buried channel structure. Charge and discharge to/from a surface inversion layer is performed using a parasitic transistor formed at a taper portion of an element isolation insulating film to perform binary storage.

A memory cell in the document (2) uses MOS transistors which are well-isolated from each other and uses a threshold voltage of the MOS transistor fixed by a well potential as binary data.

A memory cell in the document (3) is composed of MOS transistors on an SOI substrate. A large negative voltage is applied from the SOI substrate side, and by utilizing accumulation of holes in an oxide film of a silicon layer and an interface, binary storage is performed by emitting and injecting these holes.

A memory cell in the document (4) is composed of MOS transistors on an SOI substrate. The MOS transistor is one in terms of structure, but here a structure, in which a reverse conduction-type layer is formed on top of the surface of a drain diffusion region, whereby a P-MOS transistor for write and an N-MOS transistor for read are substantially combined integrally, is adopted. With a substrate region of the N-MOS transistor as a floating node, binary data are stored by its potential.

However, in the document (1), the structure is complicated and the parasitic transistor is used, whereby there is a disadvantage in the controllability of its characteristic. In the document (2), the structure is simple, but it is necessary to control potential by connecting both a drain and a source of the transistor to a signal line. Moreover, the cell size is large and rewrite bit by bit is impossible because of the well isolation. In the document (3), a potential control from the SOI substrate side is needed, and hence the rewrite bit by bit is impossible, whereby there is a difficulty in controllability. In the document (4), a special transistor structure is needed, and the memory cell requires a word line, a write bit line, a read bit line, and a purge line, whereby the number of signal lines increases.

SUMMARY OF THE INVENTION

According to one aspect of the present invention, a semiconductor memory device having MIS transistors to constitute memory cells, each of the MIS transistors comprising:
a semiconductor layer;
a source region formed in the semiconductor layer;
a drain region formed apart from the source region in the semiconductor layer, the semiconductor layer between the source region and the drain region serving as a body region in a floating state; and
a first gate which forms a channel in the body region;
a second gate formed in addition to the first gate, a potential of the second gate being fixed so as to control a potential of the body region by a capacitive coupling;
wherein the MIS transistor has a first data state in which the body region has a first potential set by impact ionization generated near a drain junction and a second data state in which the body region has a second potential set by a forward current flowing through the drain junction.

DESCRIPTION OF THE PREFERRED EMBODIMENTS

Some embodiments of the present invention will be explained below with reference to the drawings.

[Basic concept of the memory cell]

Figure 1:
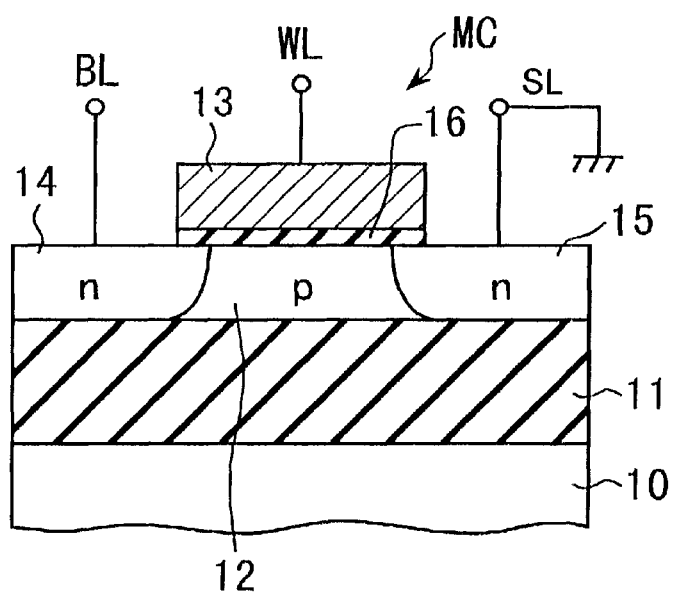
FIG. 1 is a sectional view showing a basic structure of a memory cell of a DRAM according to a basic concept of the memory cell.
Figure 2:
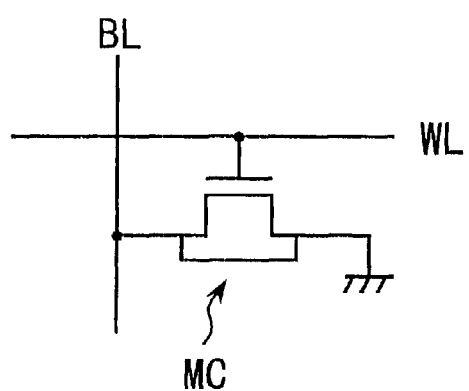
FIG. 2 is a diagram showing an equivalent circuit of the memory cell of the DRAM.

FIG. 1 shows the sectional structure of a unit memory cell of a DRAM according to a related memory cell, and FIG. 2 shows its equivalent circuit. A memory cell MC is composed of an N-channel MIS transistor with an SOI structure. Specifically, the SOI substrate, in which a silicon oxide film 11 as an insulating film is formed on a silicon substrate 10 and a p-type silicon layer 12 is formed on the silicon oxide film 11, is used. A gate electrode 13 is formed on the silicon layer 12 of this SOI substrate with a gate oxide film 16 therebetween, and n-type source/drain diffusion regions 14 and 15 are formed, being self-aligned by the gate electrode 13.

The source/drain diffusion regions 14 and 15 are formed deep to reach the silicon oxide film 11 at the bottom. Therefore, a body region composed of the p-type silicon layer 12 is insulatingly isolated from others at its bottom face and its side faces in a channel width direction if isolation in the channel width direction (a direction perpendicular to a paper surface in FIG. 1) is performed by an oxide film, and gets floating in a channel lengthwise direction by pn junction isolation.

When this memory cells MC are arranged in a matrix form, the gate electrode 13 is connected to a word line WL, the source diffusion region 15 is connected to a fixed potential line (ground potential line) SL, and the drain diffusion region 14 is connected to a bit line BL.

Figure 3:
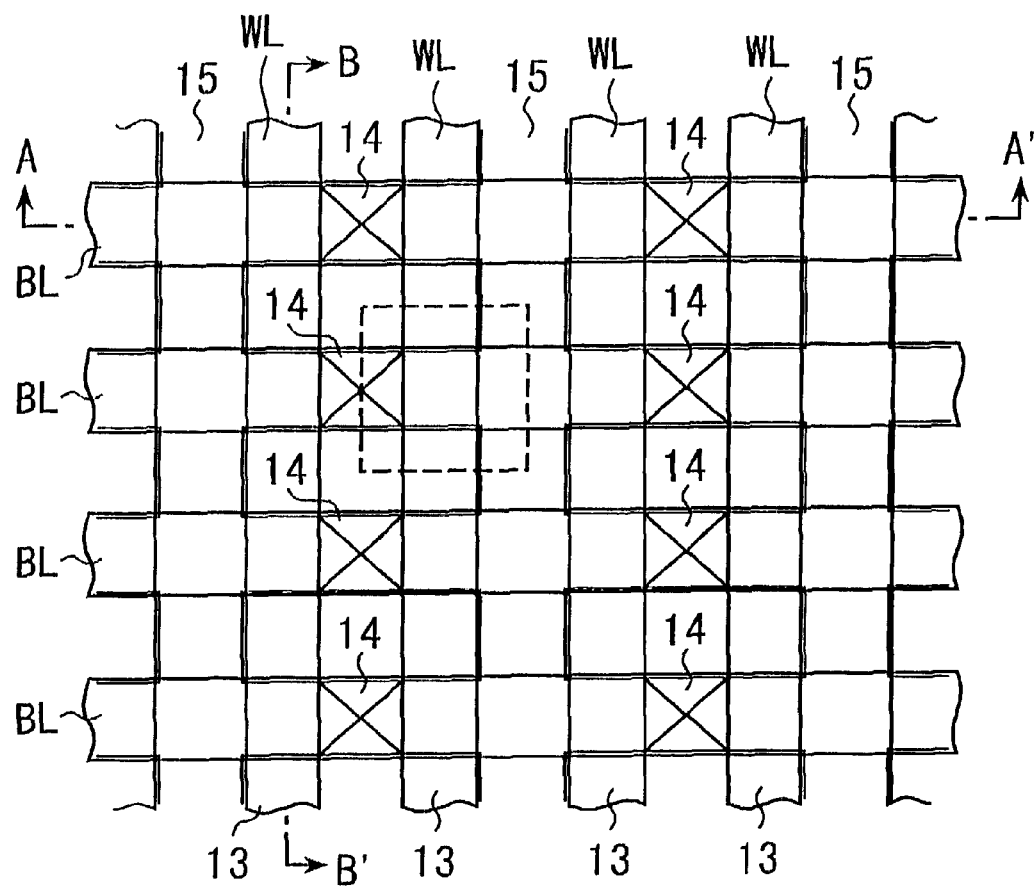
FIG. 3 is a diagram showing a layout of a memory cell array of the DRAM.
Figure 4A:
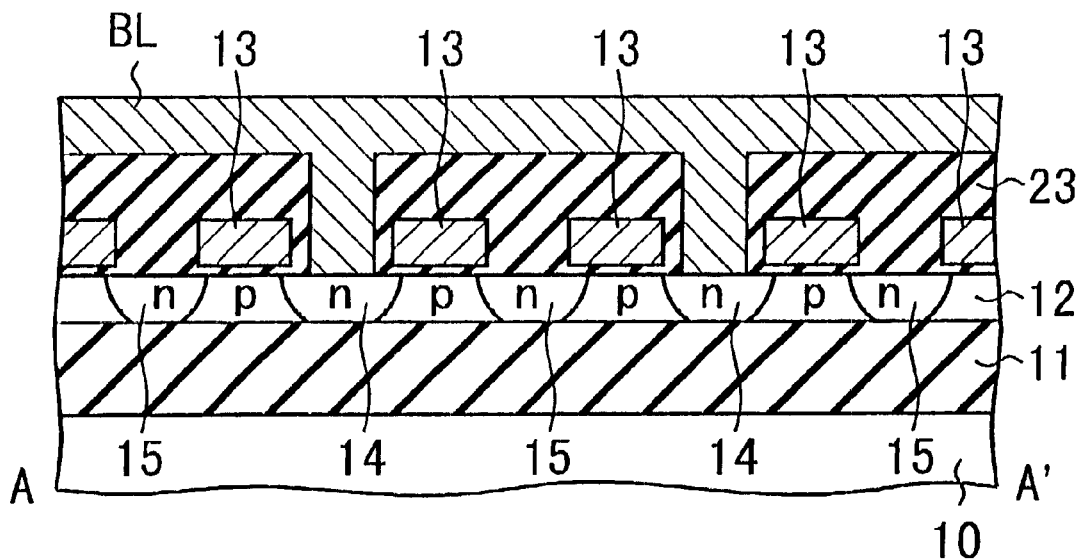
FIG. 4A is a sectional view taken along the line A–A' in FIG. 3.
Figure 4B:
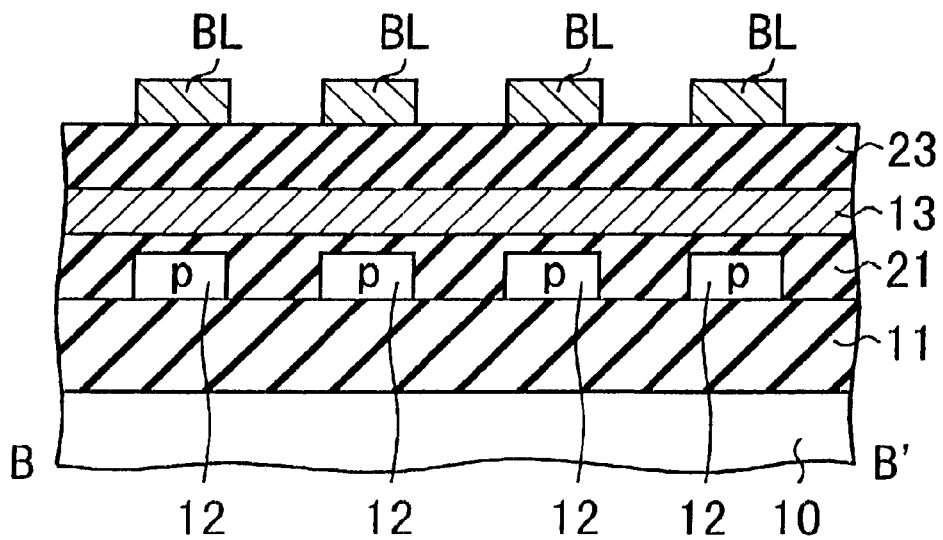
FIG. 4B is a sectional view taken along the line B–B' in FIG. 3.

FIG. 3 shows the layout of a memory cell array, and FIG. 4A and FIG. 4B respectively show sections taken along the line A–A' and the line B–B' in FIG. 3. The p-type silicon layer 12 is pattern-formed in a lattice form by embedding a silicon oxide film 21 therein. Namely, regions each of which is for two transistors sharing a drain are arranged, being element-isolated in the direction of the word line WL by the silicon oxide film 21. Alternatively, instead of embedding the silicon oxide film 21, element isolation in a crosswise direction may be performed by etching the silicon layer 12. The gate electrodes 13 are formed continuously in one direction to constitute the word lines WL. The source diffusion regions 15 are continuously formed in the direction of the word line WL to constitute the fixed potential lines (common source lines) SL. The transistor is covered with an interlayer dielectric film 23, and the bit lines BL are formed thereon. Each of the bit lines BL is disposed to be in contact with the drain diffusion regions 14, each of which is shared by two transistors, and intersect the word lines WL.

Thereby, the silicon layers 12, each being a body region of each transistor, are isolated from each other at their bottom faces and side faces in the channel width direction by the oxide film, and isolated from each other in the channel lengthwise direction by a pn junction, so that a floating state is maintained.

In this memory cell array structure, if the word line SL and the bit line BL are formed in the pitch of a minimum feature size F, a unit cell area is $2F \times 2F = 4F^2$ as shown by a broken line in FIG. 3.

The operational principle of the DRAM cell composed of these N-channel type MIS transistors utilizes the accumulation of holes which are majority carriers in the body region (the p-type silicon layer 12 insulatingly isolated from others) of the MIS transistor. Specifically, a large electric current is sent from the drain diffusion region 14 by operating the MIS transistor in a pentode region to generate impact ionization near the drain diffusion region 14. Excessive holes which are majority carriers produced by this impact ionization are held by the p-type silicon layer 12, and this state in which the holes are accumulated is defined, for example, as data "1". The state in which a forward bias is applied to the pn junction between the drain diffusion region 14 and the p-type silicon layer 12 to emit the excessive holes in the p-type silicon layer 12 to the drain side is defined as data "0".

The data "0" and "1" are stored as potential difference in the body region, that is, as difference in threshold voltage of the MIS transistor. Namely, a threshold voltage Vth1 in a data "1" state in which the potential of the body region is high due to hole accumulation is lower than a threshold voltage Vth0 in a data "0" state. In order to maintain the "1" data state in which the holes being majority carriers are accumulated in the body region, it is necessary to apply a negative bias voltage to the word line WL. This state in which the data is held is not changed even when a read operation is performed as long as the read operation is performed in a linear region and a write operation (erase) of inverted data is not performed. Namely, unlike the DRAM in which each memory cell has one transistor and one capacitor and which utilizes charge storage by the capacitor, non-destructive read-out is possible.

Figure 5:
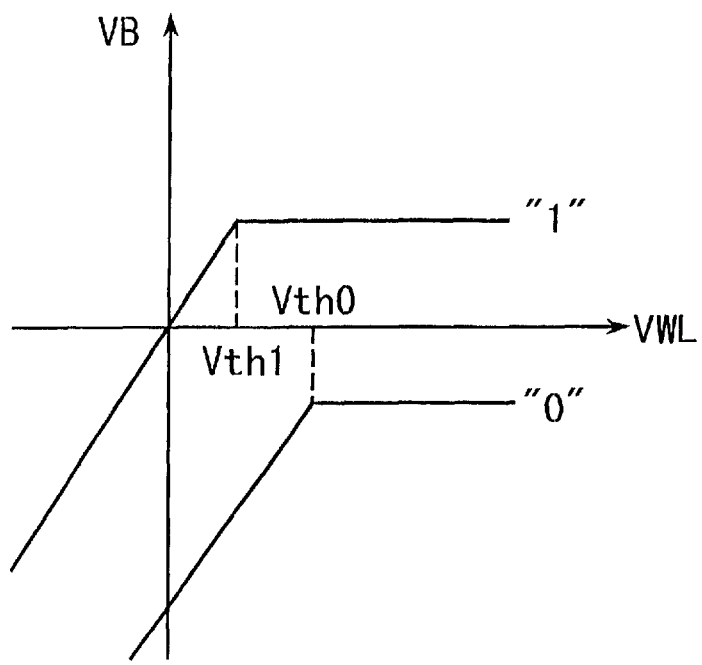
FIG. 5 is a diagram showing the relation between a word line potential and a body potential of the DRAM cell.
Figure 6:
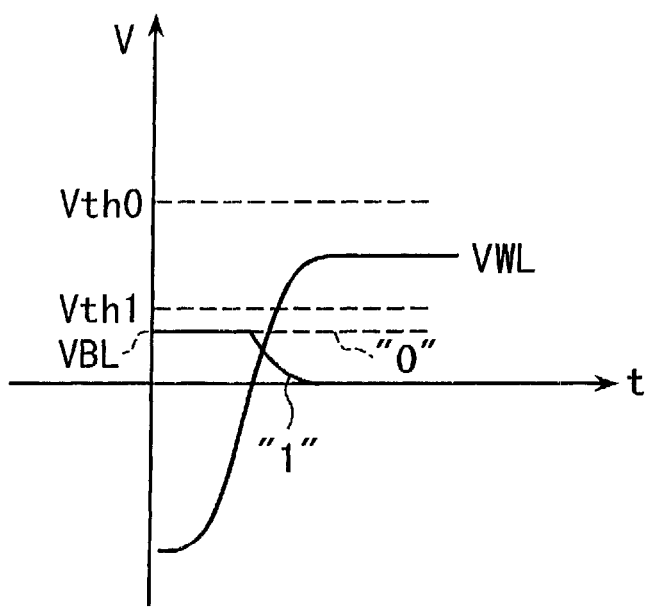
FIG. 6 is a diagram for explaining a read method of the DRAM cell.

Some methods for reading data are presented. The relation between a word line potential Vwl and a body potential VB is shown in FIG. 5 in relation to the data "0" and "1". A first method of reading data utilizes the event that the word line WL is given a read potential which has an intermediate value between the threshold voltages Vth0 and Vth1 of the data "0" and "1", and that a current is not passed through the memory cell storing the "0" data, while a current is passed through the memory cell storing the "1" data. More specifically, for example, the bit line BL is precharged at a predetermined potential VBL, and thereafter the word line WL is driven. Thereby, as shown in FIG. 6, in the case of the "0" data, the precharge potential VBL of the bit line does not change, while in the case of the "1" data, the precharge potential VBL lowers.

Figure 7:
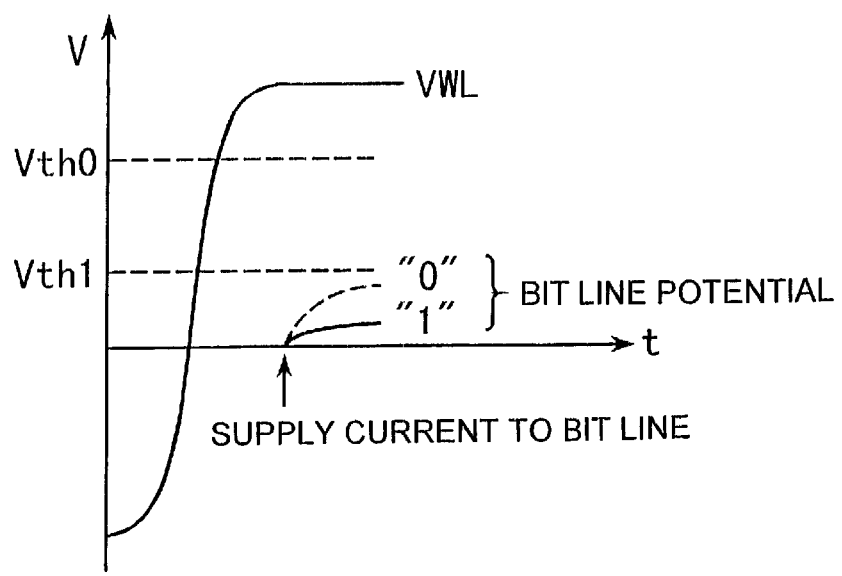
FIG. 7 is a diagram for explaining a different read method of the DRAM cell.

A second read method utilizes the event that after the potential of the word line WL is raised, a current is supplied to the bit line BL, and that the increasing speed of the bit line potential is different according to the conductivity of "0" and "1". In brief, the bit line BL is precharged at 0V, the potential of the word line WL is raised, and then a current is supplied to the bit line as shown in FIG. 7. By detecting a difference in bit line potential increase by using a dummy cell at this time, data distinction becomes possible.

A third read method is a method of reading difference in current to the bit line BL which differs according to "0" and "1" when the bit line BL is clamped at a predetermined potential. A current-voltage conversion circuit is necessary to read current difference, and finally potential difference is differentially amplified and a sense output is given.

In this related memory cell, in order to selectively write the "0" data, that is, in order to emit excessive holes only from the body region of the memory cell selected by potentials of the selected word line WL and bit line BL in the memory cell array, capacitive coupling of the word line WL and the body region is important. A state in which holes are accumulated in the body region in the case of the data "1" needs to be maintained in a state in which the word line is fully biased in a negative direction, whereby the capacitance between the gate and the substrate of the memory cell is the capacitance of the gate oxide film (namely, in a state in which no depletion layer is formed in the surface).

Moreover, it is desirable that the write operation be performed by pulse write to reduce electric power consumption in the case of both "0" and "1". When "0" written, a hole current is sent from the body region to the drain of the selected transistor, while an electron current is sent from the drain to the body region, but no hole is injected into the body region.

More concrete operating waveforms will be explained. FIG. 8 to FIG. 11 show read/refresh and read/write operating waveforms when the first read method of performing data distinction by the presence or absence of electric discharge of the bit line in the selected cell is used.

Figure 8:
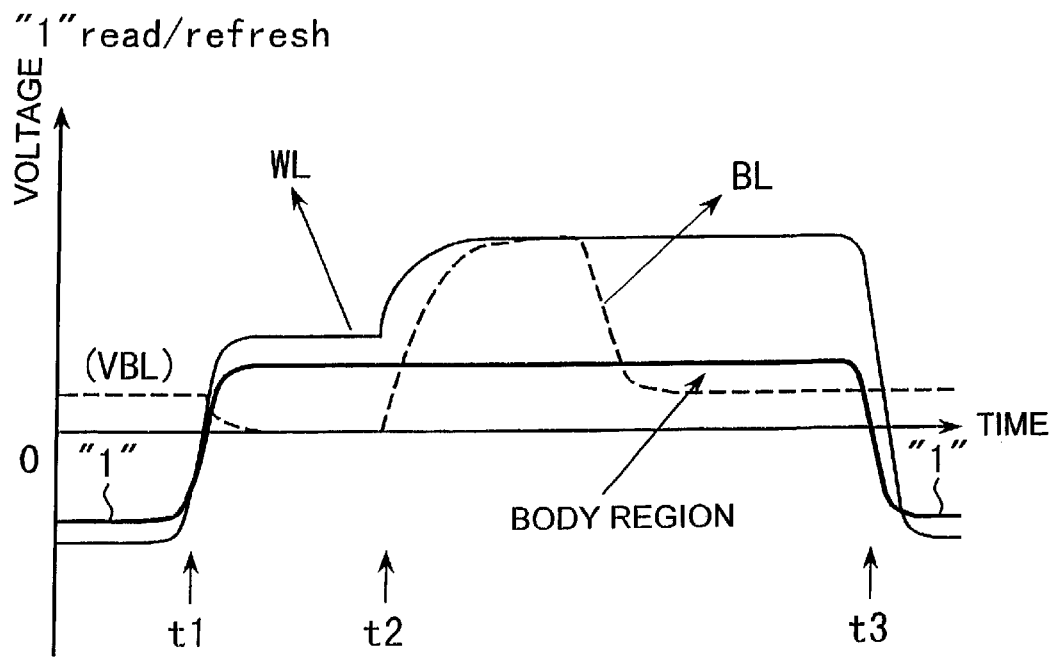
FIG. 8 is a diagram showing an operating waveform of "1" data read/refresh of the DRAM.
Figure 9:
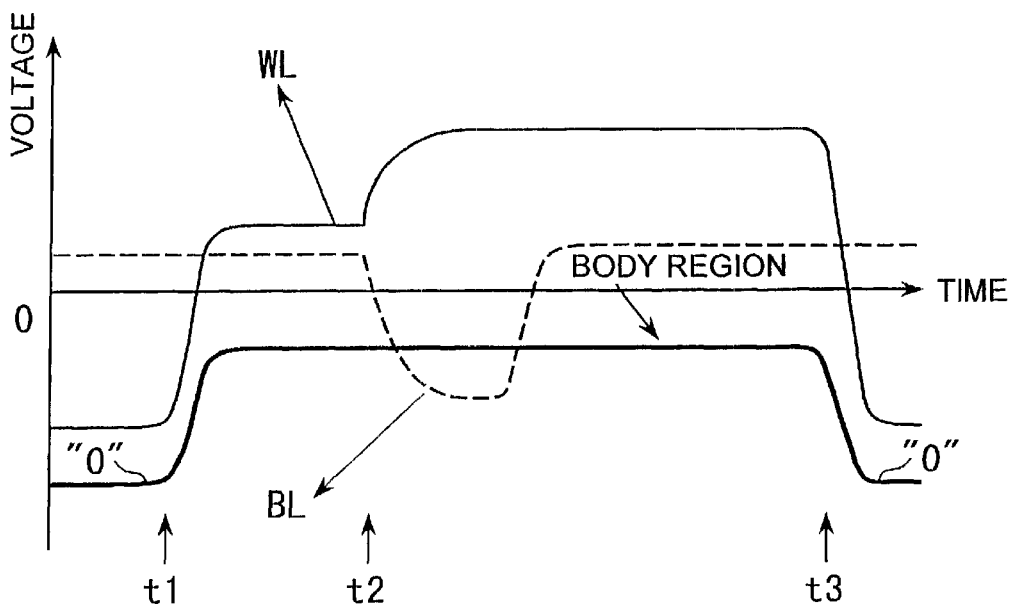
FIG. 9 is a diagram showing an operating waveform of "0" data read/refresh of the DRAM.

FIG. 8 and FIG. 9 respectively show read/refresh operations of the "1" data and the "0" data. Until a point in time t1, a data holding state (a non-selected state) lasts and a negative potential is given to the word line WL. At the point in time t1, the word line WL is raised to a positive predetermined potential. At this time, the potential of the word line is set at a value between the thresholds Vth0 and Vth1 of the "0" and "1" data. As a result, in the case of the "1" data, the bit line BL precharged in advance comes to have a lower potential by electric discharge. In the case of the "0" data, the bit line potential VBL is held. Hence, the data "1" and "0" can be distinguished.

At a point in time t2, the potential of the word line WL is further increased. At the same time, when the read data is "1", a positive potential is given to the bit line BL (FIG. 8), and when the read data is "0", a negative potential is given to the bit line BL (FIG. 9). Thereby, when the selected memory cell stores the "1" data, a large channel current is passed by a pentode operation to generate impact ionization, whereby excessive holes are injected into the body region and held therein, and thus the "1" data is written again. In the case of the "0" data, a forward bias is applied to a drain junction, and thereby the "0" data in which no excessive hole is held in the body region is written again.

At a point in time t3, the word line WL is biased in the negative direction, and the read/refresh operation is completed. In other non-selected memory cells which are connected to the same bit line BL as the memory cell which has read the "1" data, the word line WL is held at a negative potential, and hence the body region thereof is held at a negative potential, whereby impact ionization does not occur. In other non-selected memory cells which are connected to the same bit line BL as the memory cell which has read the "0" data, the word line WL is held at a negative potential as well, whereby hole emission does not occur.

Figure 10:
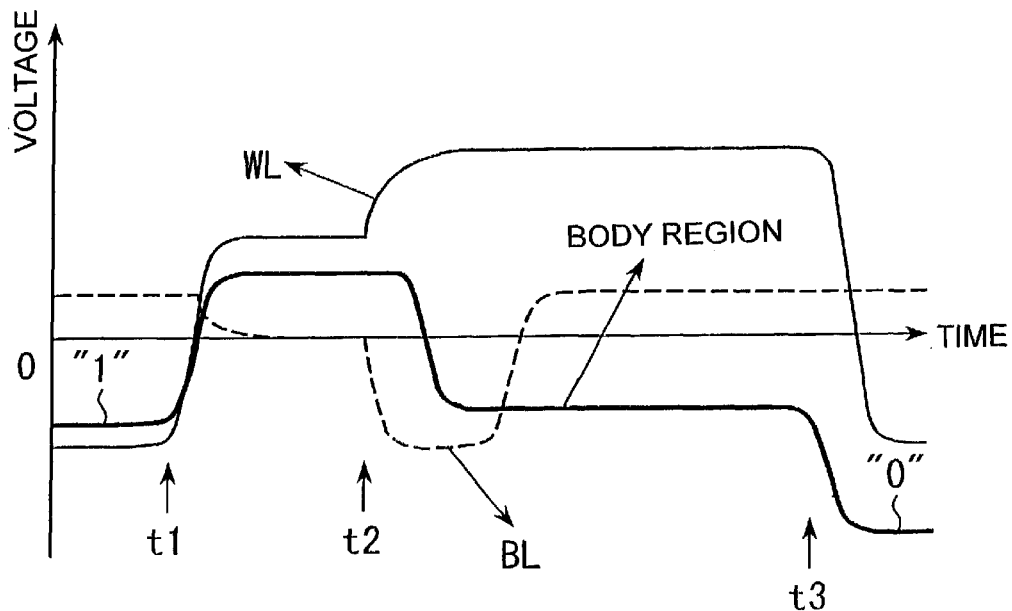
FIG. 10 is a diagram showing an operating waveform of "1" data read/"0" data write of the DRAM.
Figure 11:
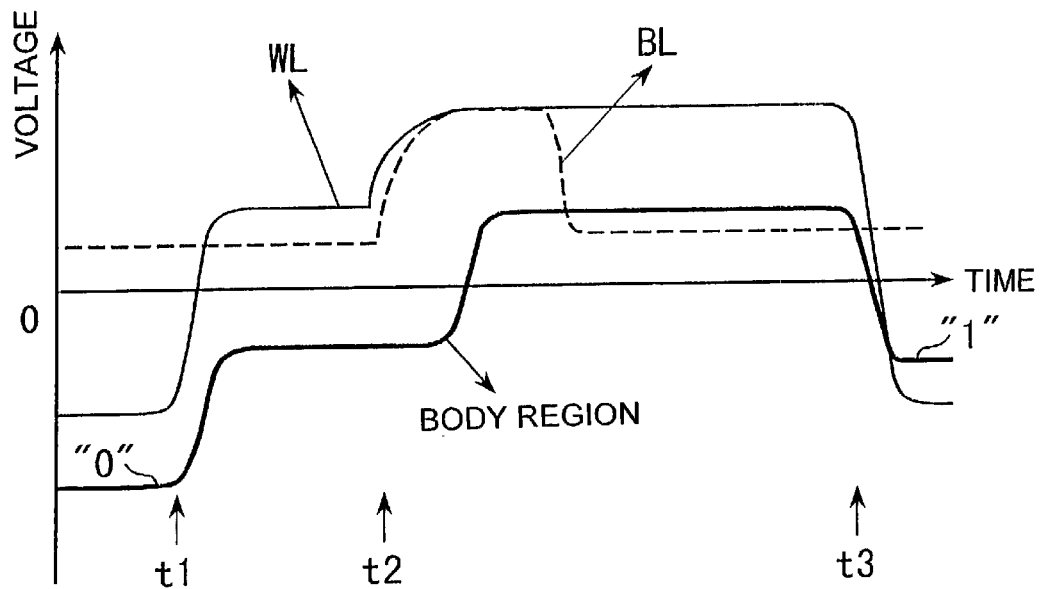
FIG. 11 is a diagram showing an operating waveform of "0" data read/"1" data write of the DRAM.

FIG. 10 and FIG. 11 show read/write operations of the "1" data and the "0" data by the same read method. The read operations at the point in time t1 in FIG. 10 and FIG. 11 are the same as in FIG. 8 and FIG. 9. After read, at the point in time t2, the potential of the word line WL is further increased. When the "0" data is written in the same selected cell, a negative potential is given to the bit line BL (FIG. 10), and when the "1" data is written, a positive potential is given to the bit line BL (FIG. 11). Thereby, in the cell which the "0" data is given, a forward bias is applied to the drain junction, and holes in the body region are emitted. Meanwhile, in the cell which the "1" data is given, impact ionization occurs around the drain, and excessive holes are injected into the body region and held therein.

FIG. 12 to FIG. 15 show operating waveforms of read/refresh and read/write when the second read method of supplying a current to the bit line BL after the selection of the word line and performing data distinction by the potential increasing speed of the bit line BL is used.

Figure 12:
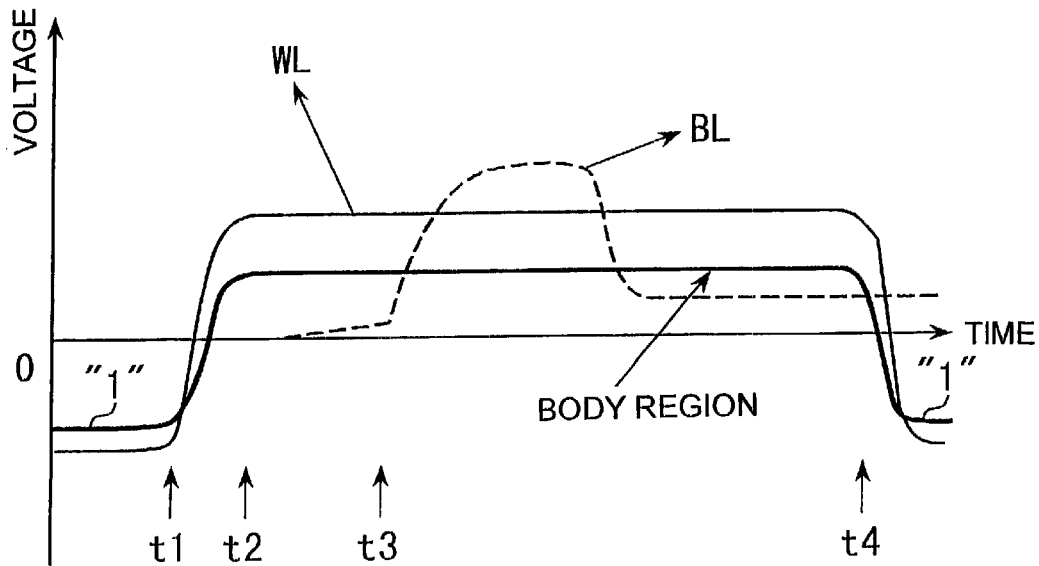
FIG. 12 is a diagram showing an operating waveform of "1" data read/refresh by the different read method of the DRAM.
Figure 13:
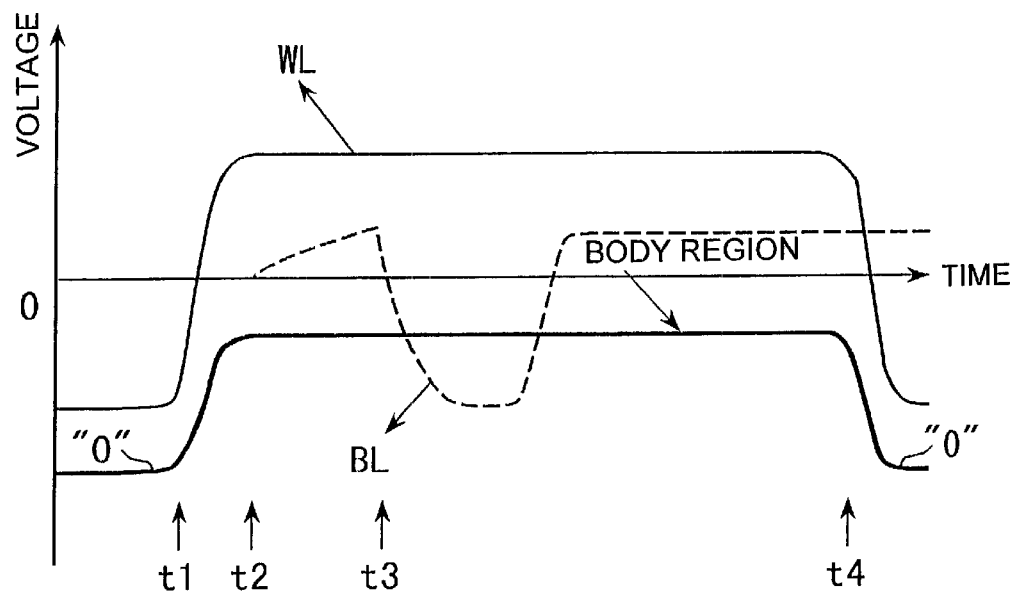
FIG. 13 is a diagram showing an operating waveform of "0" data read/refresh by the different read method of the DRAM.

FIG. 12 and FIG. 13 respectively show read/refresh operations of the "1" data and the "0" data. The word line WL which is held at a negative potential is raised to a positive potential at the point in time t1. At this time, the potential of the word line is set at a value higher than both the thresholds Vth0 and Vth1 of the "0" and "1" data as shown in FIG. 7. Alternatively, similarly to the first read method, the potential of the word line may be set at a value between the thresholds Vth0 and Vth1 of the "0" and "1" data. Then, a current is supplied to the bit line at the point in time t2. Thereby, in the case of the "1" data, the memory cell is turned on deeply and an increase in the potential of the bit line BL is small (FIG. 12), while in the case of the "0" data, a current in the memory cell is small (or no electric current is passed) and the potential of the bit line increases rapidly. Hence, the "1" and "0" data can be distinguished.

At the point in time t3, a positive potential is given to the bit line BL when the read data is "1" (FIG. 12), while a negative potential is given to the bit line BL when the read data is "0" (FIG. 13). Consequently, when the selected memory cell stores "1" data, a drain current is sent to generate impact ionization, excessive holes are injected into the body region and held therein, and the "1" data is written again. In the case of the "0" data, a forward bias is applied to the drain junction, and the "0" data in which there are no excessive holes in the body region is written again.

At a point in time t4, the word line WL is biased in the negative direction, and the read/refresh operation is completed.

Figure 14:
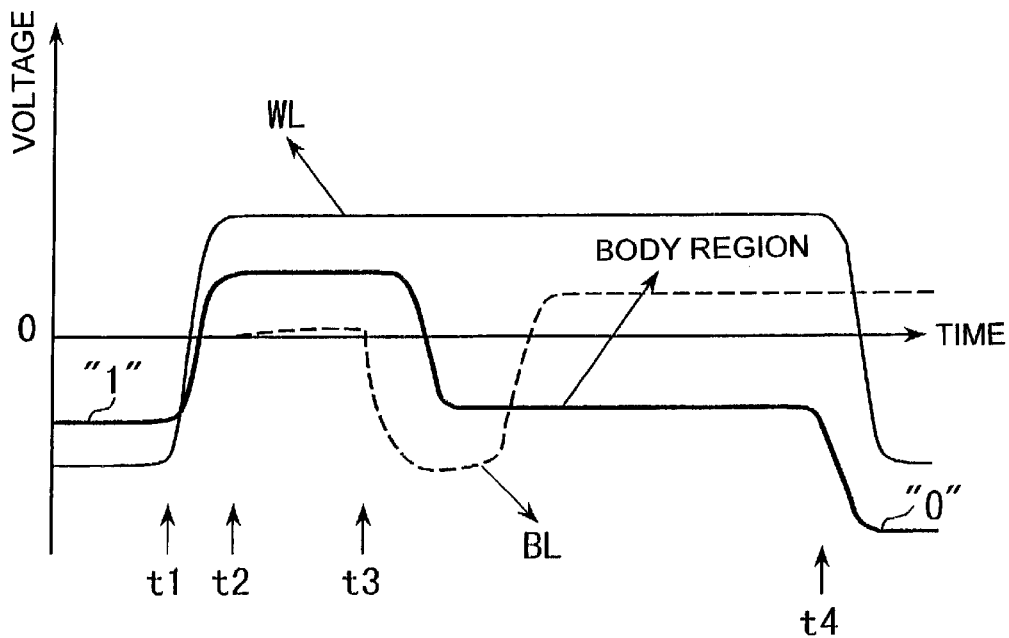
FIG. 14 is a diagram showing an operating waveform of "1" data read/"0" data write by the different read method of the DRAM.
Figure 15:
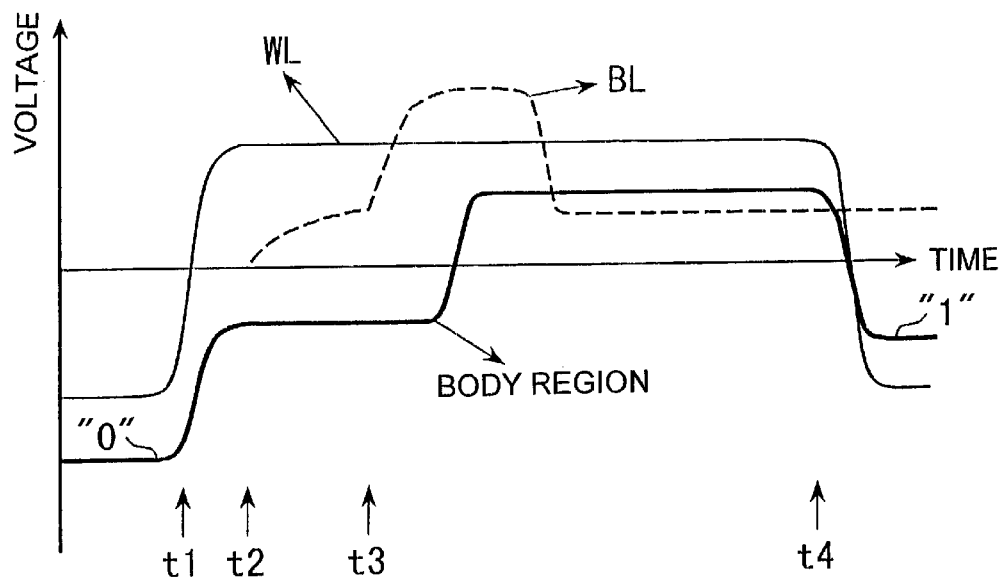
FIG. 15 is a diagram showing an operating waveform of "0" data read/"1" data write by the different read method of the DRAM.

FIG. 14 and FIG. 15 respectively show read/write operations of the "1" data and "0" data by the same read method. The read operations at the points in time t1 and t2 in FIG. 14 and FIG. 15 are the same as in FIG. 12 and FIG. 13. When the "0" data is written in the same selected cell after read, a negative potential is given to the bit line BL (FIG. 14), and when the "1" data is written, a positive potential is given to the bit line BL (FIG. 15). Thereby, in the cell which the "0" data is given, a forward bias is applied to the drain junction, and excessive holes in the body region are emitted. Meanwhile, in the cell which the "1", data is given, a large drain current is sent thereto to generate impact ionization around the drain, and excessive holes are injected into the body region and held therein.

As described above, the DRAM cell according to the related memory cell is composed of the simple MIS transistor having the floating body region which is electrically isolated from others, and the cell size of $4F^2$ can be realized. Capacitive coupling from the gate electrode is used for the potential control of the floating body region, and the source diffusion region has also a fixed potential. Namely, the read/write control is performed by the word line WL and the bit line BL only, which is simple. Moreover, data in the memory cell are basically non-destructively read out, whereby it is unnecessary to provide a sense amplifier in each bit line, which facilitates the layout of the sense amplifiers. In addition, since it adopts a current read method, it is not affected by noise, whereby read is possible, for example, even by an open bit line system. Moreover, the process of manufacturing the memory cell is simple.

The SOI structure is an important technique when improvement in the performance of a logic LSI in future is considered. The DRAM according to the basic memory cell is very promising also when mounted together with such a logic LSI having the SOI structure. Unlike a related DRAM using a capacitor, the DRAM in the embodiment does not need a process different from that of the logic LSI, and hence its manufacturing process is simplified.

Furthermore, the DRAM having the SOI structure according to the basic concept of the memory cell has an advantage that an excellent memory holding characteristic can be obtained compared with the case where a related one transistor/one capacitor-type DRAM is formed to have the SOI structure. Specifically, if the related one transistor/one capacitor-type DRAM is formed to have the SOI structure, holes are accumulated in a floating semiconductor body region, the threshold of a transistor decreases, and thereby a subthreshold current in the transistor is increased, which deteriorates a memory holding characteristic. On the other hand, in the memory cell having only one transistor according to the embodiment, a transistor path which decreases memory charge does not exist, and hence a data holding characteristic is determined by only leakage from the pn junction, which eliminates a problem of subthreshold leakage.

For the basic DRAM cell described above, it is important for memory characteristics how large the difference in the threshold voltage can be obtained between the data "0" and the data "1" which are stored as a potential difference in the channel body (body region). According to a result of a simulation in term of this point, when the data write operation is performed with a potential control of the channel body by the capacitive coupling from the gate, it has become apparent that, in comparison with the difference in the body potential between the data "0" and "1" immediately after the write operation, the difference in the body potential between the data "0" and "1" after that is smaller. The result of the simulation will be explained next.

A condition for the device is as follows:

a gate length Lg=0.35 $\mu$m;

a thickness tSi of the p-type silicon layer 12=100 nm;

an acceptor concentration NA=5×10$^{17}$/cm$^3$;

a donor concentration ND of the source region 14 and the drain region 15=5×10$^{20}$/cm$^3$; and a thickness tox of the gate oxide film=10 nm.

Figure 16:
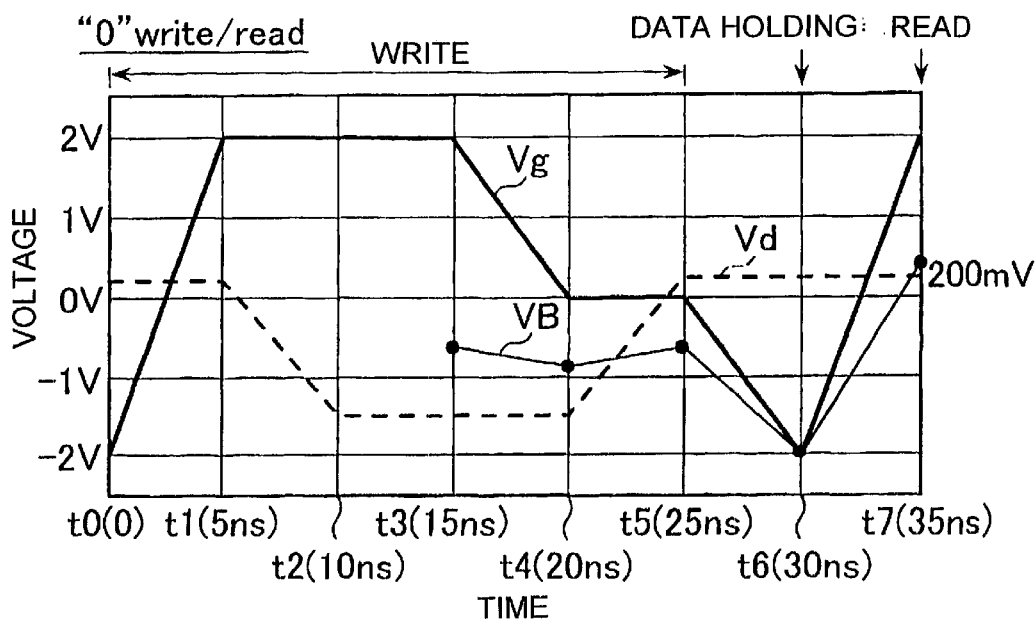
FIG. 16 is a diagram showing a change of a body potential by a simulation of "0" data write/read of the DRAM cell.
Figure 17:
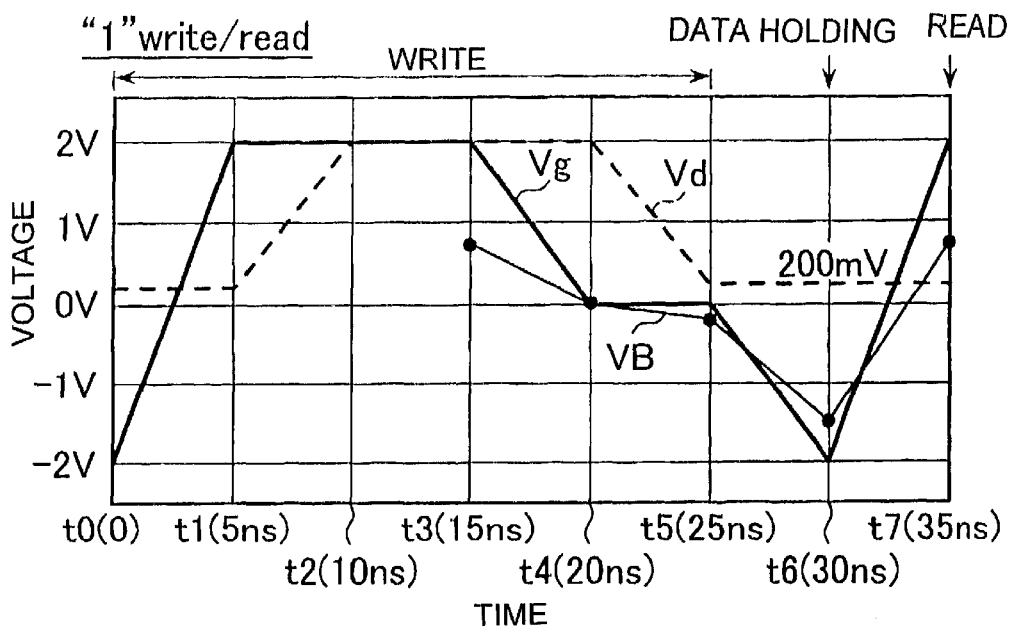
FIG. 17 is a diagram showing a change of body potential by a simulation of "1" data write/read of the DRAM cell.

FIG. 16 shows relation among a gate potential Vg, a drain potential Vd and a channel body potential VB during the "0" data write operation and the subsequent data holding and data read operation (indicated by an instant value, respectively). FIG. 17 also shows relation among a gate potential Vg, a drain potential Vd and a channel body potential VB during the "1" data write operation and the subsequent data holding and data read operation (indicated by an instant value, respectively).

Figure 18:
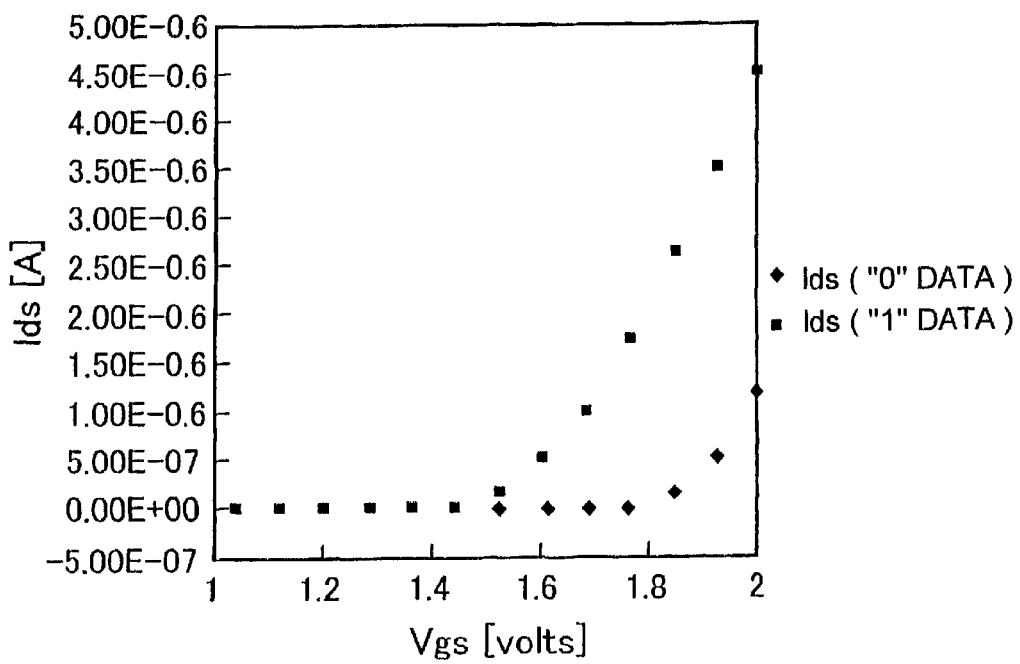
FIG. 18 is a diagram showing characteristics of a drain current versus a gate voltage by the simulation of "0" and "1" data read.

Moreover, in order to observe the threshold voltage Vth0 of the "0" data and the threshold voltage Vth1 of the "1" data in the data read operation from time t6 to time t7, a drain current Ids and a gate-source voltage Vgs during that time are described as FIG. 18. Here, a channel width W and a channel length L are set at W/L=0.175 $\mu$m/0.35 $\mu$m, and a drain-source voltage is set at Vds=0.2 V.

As shown in FIG. 18, a difference $\Delta$Vth between the threshold voltage Vth0 of the "0" write cell and the threshold voltage Vth1 of the "1" write cell is ΔVth=0.32 V. As understood by the result of the above-analysis, there is a problem that the difference of the body potential becomes small. Specifically, in FIGS. 16 and 17, the body potential is VB=−0.77 V immediately after the "0" write operation (at time t3) and the body potential is VB=0.85 V immediately after the "1" write operation, so that the difference thereof is 1.62 V. On the other hand, in the data holding state (time t6), the body potential of the "0" write cell is VB=−2.04 V and the body potential of the "1" write cell is VB=−1.6 V, so that the difference thereof is 0.44 V.

There are two reasons why the difference between data "0" and "1" in the body potential in the data holding state becomes smaller than that immediately after the write operation.

One of the reasons is that the capacitive coupling from the gate to the body region is different according to whether the data is "0" or "1". The drain is at −1.5 V immediately after the "0" write operation (during time t3 through time t4), whereas the drain is at 2 V immediately after the "1" write operation. Therefore, when the gate potential Vg is lowered after that, the channel easily disappears in the "1" write cell and the capacitance between the gate and the body region becomes tangible, so that the holes are accumulated in the body region more and more and the capacitance becomes larger and larger. On the other hand, the channel does not easily disappear in the "0" write cell, so that the capacitance between the gate and the body region does not become tangible.

It seems that the above-mentioned unbalance is dissolved if the drain potential is set at 200 mV before the gate potential is started to be lower. In this case, however, in the "0" write cell, the drain potential rises in the state in which the channel is formed, and the current flows by a triode operation. Then, since the body potential lowered once by the "0" write operation rises by the capacitive coupling between the n-type drain and channel-inverted layer and the p-type body region, it is not preferable.

The other of the reasons is that the body potential is influenced by the pn junction capacitance between the source or drain region and the body region and then this operates to reduce a signal amount of the "0" and "1" data.

Therefore, in embodiments hereinafter, a further gate (second gate) for controlling the potential of the channel body by the capacitive coupling is added to the above-mentioned basic DRAM in addition to the gate (first gate) for controlling the channel forming. In order to secure the capacitance between the channel body and the second gate, the potential of the second gate may be fixed so that the surface at the side of the second gate of the body region is in an accumulation state (including flat band state). For example, the second gate may be fixed at a potential (a negative potential in the case of an n-channel) lower than a reference voltage supplied to the source region. Or, a fixed potential such that the surface at the side of the second gate of the body region is in a depletion state in the range of not forming an inverted layer may be supplied to the second gate. As a result, this is substantially equivalent to increasing the thickness of the gate insulating film for the second gate.

Specific embodiments will be explained hereinafter.

[First and second embodiments]

Figure 19:
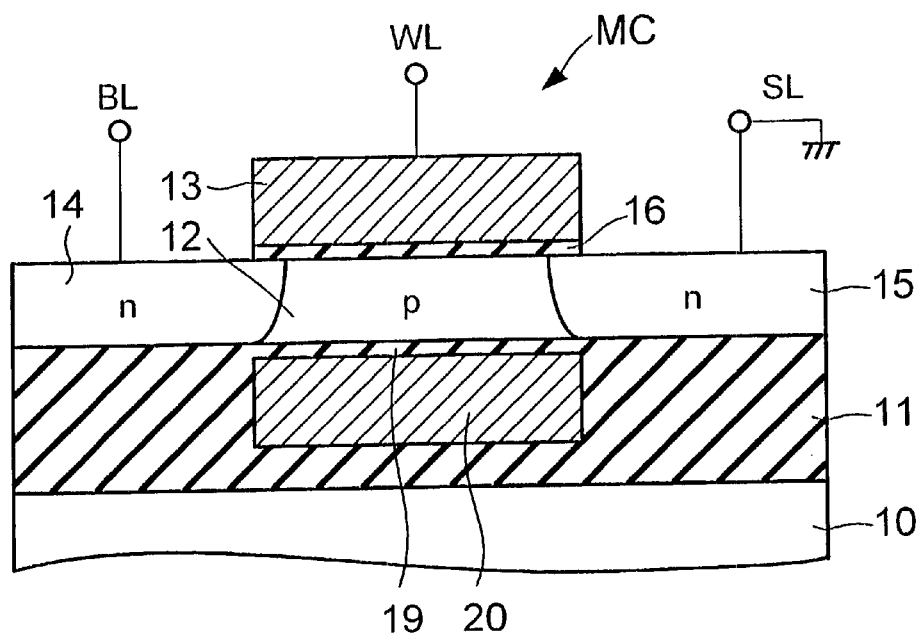
FIG. 19 is a sectional view showing a structure of a DRAM cell according to a first embodiment.

FIG. 19 shows a structure of a DRAM cell according to a first embodiment by contrast with FIG. 1. The basic structure is similar to that of FIG. 1. However, a different point from FIG. 1 is that a second gate 20 is buried in the oxide film 11 in addition to the first gate 13 for channel control and the second gate 20 is capacitive-coupled with the silicon layer (body region) 12 via a gate insulating film 19. In this embodiment, the thickness of the gate insulating film 19 is substantially equal to that of the gate insulating film 16 at the side of the first gate 13.

As described later, in the actual cell array structure, the first gate 13 is continuously formed to constitute a word line, and the second gate 20 is continuously formed as a wiring in parallel with the word line. For example, a negative fixed potential is supplied to the second gate 20.

Figure 20:
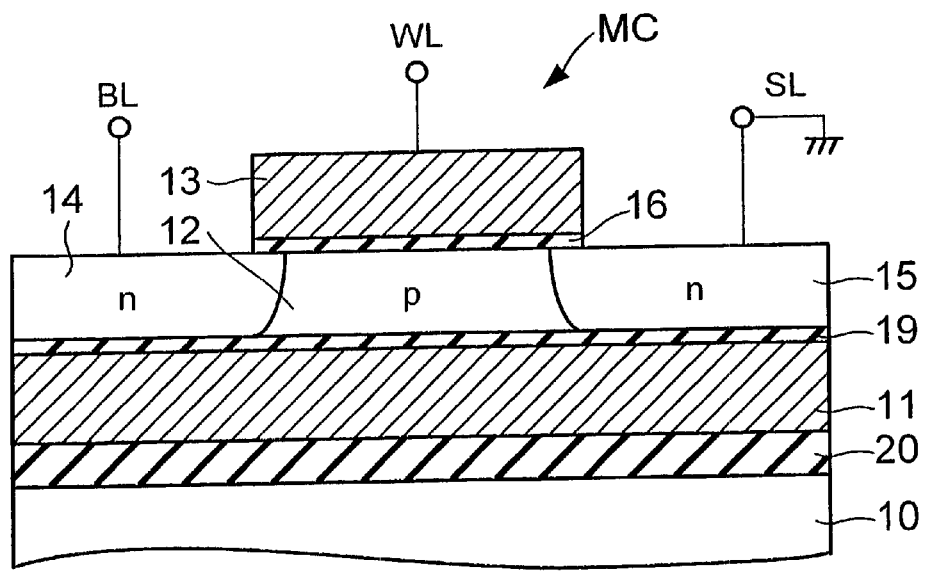
FIG. 20 is a sectional view showing a structure of a DRAM cell according to a second embodiment.

FIG. 20 shows a structure of a DRAM cell according to a second embodiment. In this embodiment, the second gate 20 is not patterned as the wiring unlike the first embodiment of FIG. 19, but the second gate 20 is provided as a common gate (back plate) so as to be shared among the plurality of memory cell. In this embodiment, the second gate 20 is shared among all the cell arrays in particular. In such a structure, it is unnecessary to adjust the position between the second gate 20 and the first gate 13 in its manufacturing process, which is simplified.

Next, the result of the same simulation as the basic cell structure will be explained concerning the DRAM cell of the above-mentioned first and second embodiments. The device condition is that the second gate 20 is a $p^+$-type polysilicon and fixed in potential at −2 V. The thickness of the gate insulating film 19 is 10 nm and this is the same thickness as the gate insulating film 16 at the side of the first gate 13. The other conditions are the same as the DRAM cell according to the basic cell structure.

Figure 21:
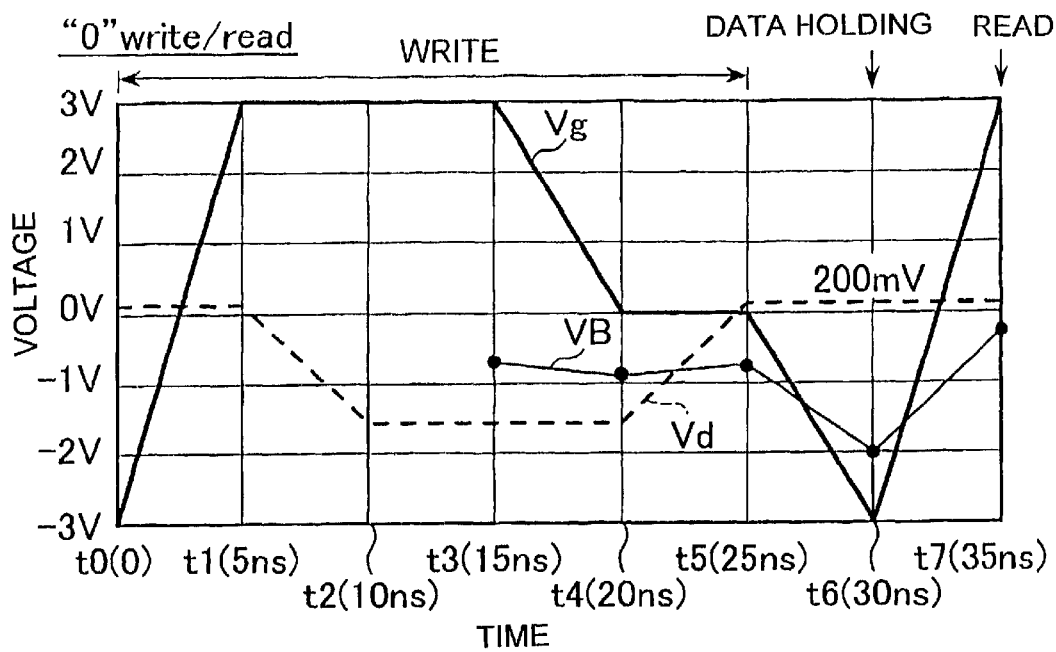
FIG. 21 is a diagram showing a change of a body potential by a simulation of "0" data write/read of the DRAM cell.
Figure 22:
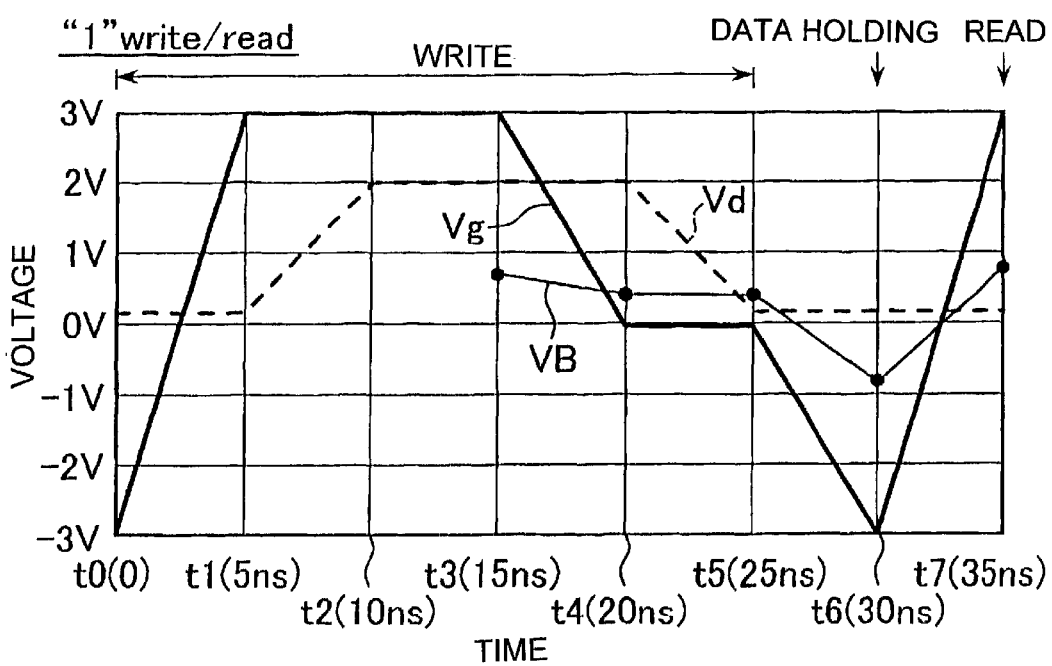
FIG. 22 is a diagram showing a change of body potential by a simulation of "1" data write/read of the DRAM cell.

FIG. 21 shows relation among a gate potential Vg, a drain potential Vd and a channel body potential VB during the "0" data write operation and the subsequent data holding and data read operation (indicated by an instant value, respectively). FIG. 22 also shows relation among a gate potential Vg, a drain potential Vd and a channel body potential VB during the "1" data write operation and the subsequent data holding and data read operation (indicated by an instant value, respectively).

As shown in FIGS. 21 and 22, the body potential is VB=−0.82 V immediately after the "0" write operation (at time t3) and the body potential is VB=0.84 V immediately after the "1" write operation, so that the difference thereof is 1.66 V. On the other hand, in the data holding state (time t6), the body potential of the "0" write cell is VB=−1.98 V and the body potential of the "1" write cell is VB=−0.86 V, so that the difference thereof is 1.12 V. In short, the change of the body potential difference between the time immediately after the write operation and the time during the data holding in the first and second embodiments is smaller than that in the basic cell structure.

Figure 23:
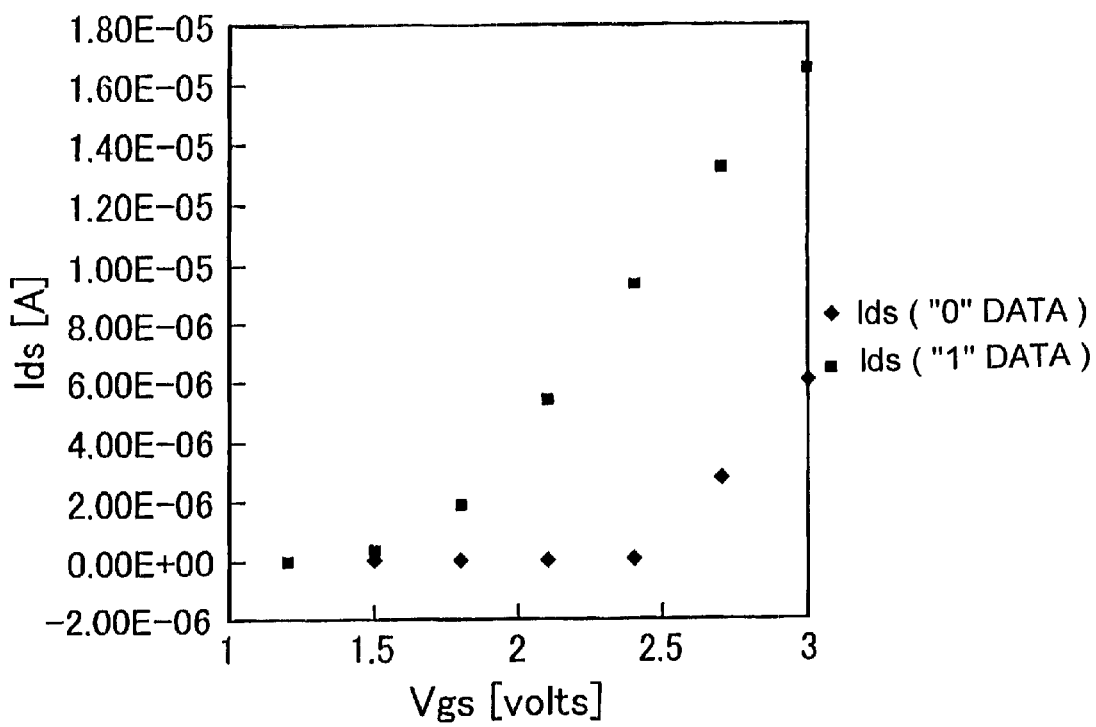
FIG. 23 is a diagram showing characteristics of a drain current versus a gate voltage by the simulation of "0" and "1" data read.

FIG. 23 shows a graph of the drain current Ids versus the gate-source voltage Vgs in order to observe the threshold voltage Vth0 of the "0" data and the threshold voltage Vth1 of the data "1" at data read operation during time t6 through time t7 by contrast with FIG. 18. As understood by this graph, the difference ΔVth between the threshold voltage Vth0 of the "0" data and the threshold voltage Vth1 of the "1" data is ΔVth=0.88 V. Therefore, in comparison with the basic cell structure, a large signal difference between the "0" and "1" data can be obtained.

Figure 24:
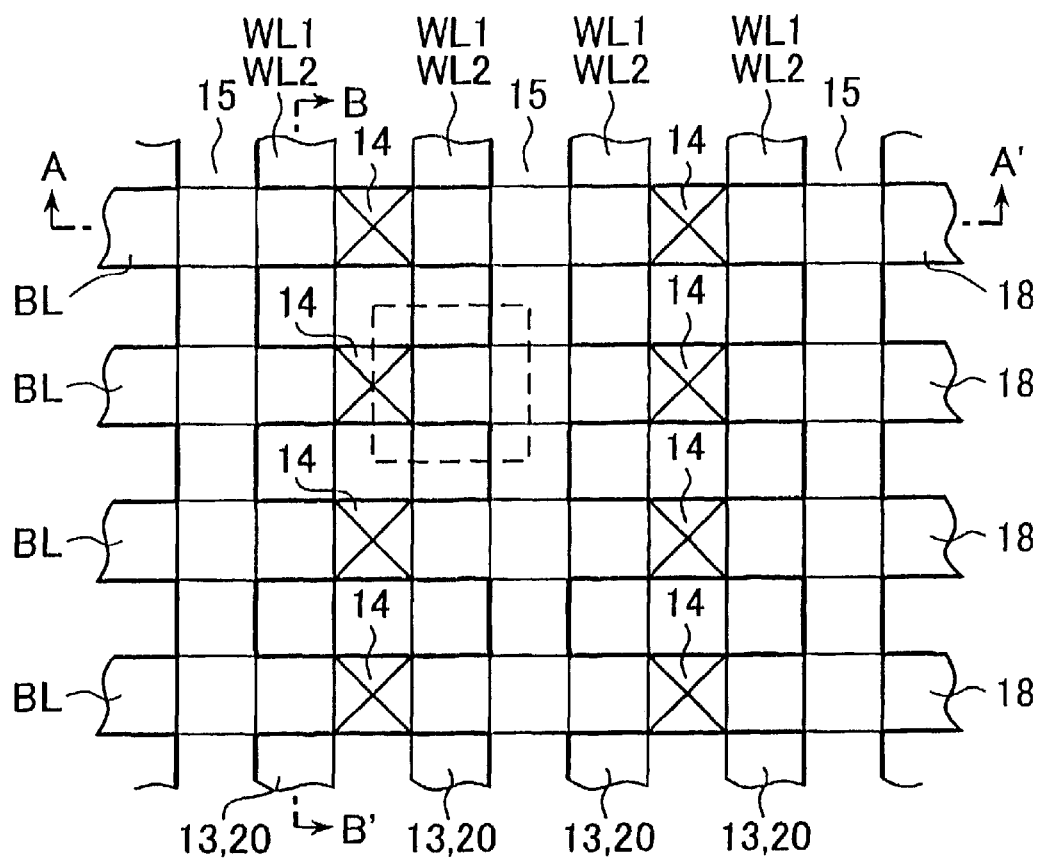
FIG. 24 is a diagram showing the layout of a memory cell array including the DRAM cells in FIG. 19.
Figure 25A:
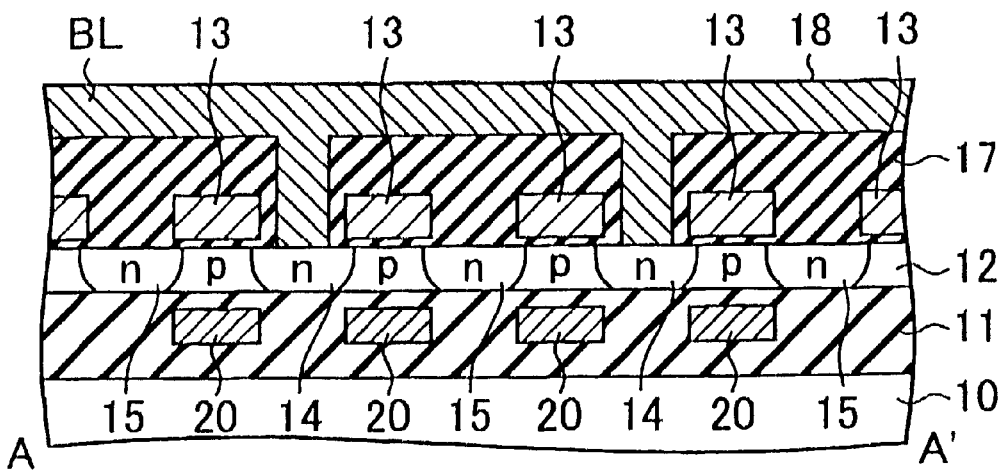
FIG. 25A is a sectional view taken along the line A–A' in FIG. 24.
Figure 25B:
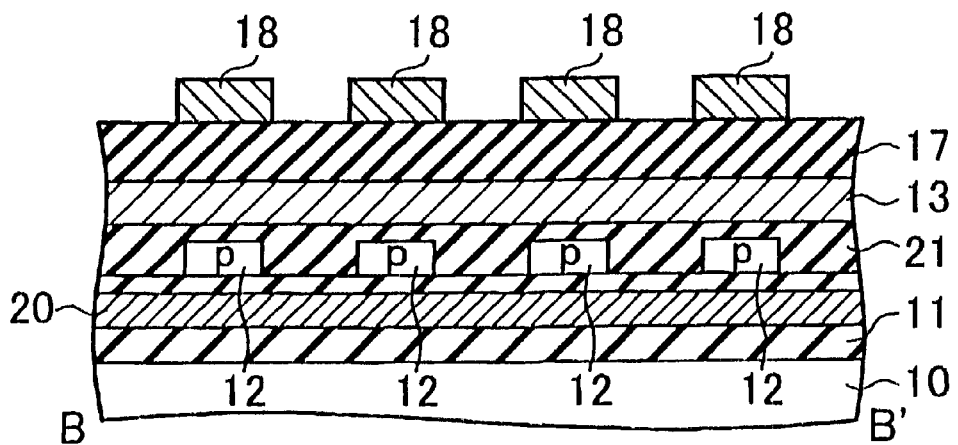
FIG. 25B is a sectional view taken along the line B–B' in FIG. 24.

FIG. 24 shows a layout of a memory cell array in which the DRAM cell structure of FIG. 19 is adopted. FIG. 25A is a sectional view taken along the line A–A' in FIG. 24, and FIG. 25B is a sectional view taken along the line B–B' in FIG. 24. The first gates 13 are continuously formed in one direction to constitute word lines WL1. Corresponding the word lines WL1, the second gates 20 are continuously formed to constitute word lines WL2 in parallel with the word line WL1. However, the word lines WL2 are fixed at a predetermined potential as described above. The other structure is the same as the structure of basic DRAM cell shown in FIGS. 3 and 4, and hence the cell area of $4F^2$ can be realized.

As mentioned above, it becomes apparent that the back gate or the back plate is formed for the body region of the DRAM cell to fix its potential, so that the large threshold voltage difference between the "0" and "1" data can be obtained. In this case, however, there is a possibility that amplitude of the voltage of the word lines becomes large. Because, in order to realize a selective "0" data write operation in the cell array, the body potential of the "1" data write cell in the data holding state has to be equal to or lower than the body potential immediately after the "0" data write operation.

More specifically, when the voltage of the selected word line is raised to write the "0" data in the selected cell among the cells commonly connected to the bit line in the DRAM, it is necessary to enough lower the voltage of the non-selected word lines so as to hold data in the non-selected cell stored the "1" data. In addition, since there is the capacitive coupling between the back gate or back plate and the body region, the capacitive coupling between the first gate (front gate) and the body region is relatively small, so that it is necessary to increase the width of the word lines.

As a result of this, it is necessary to adjust the value of the capacitive coupling between the first and second gates and the channel body to optimal condition. For this purpose, the thickness of the second gate insulating film 19 between the second gate 20 and the silicon layer 12 may be optimized in terms of the first gate insulating film 16 between the first gate 13 and the silicon layer 12. An embodiment in which this point is considered will be explained hereinafter.

[Third embodiment]

Figure 26A:
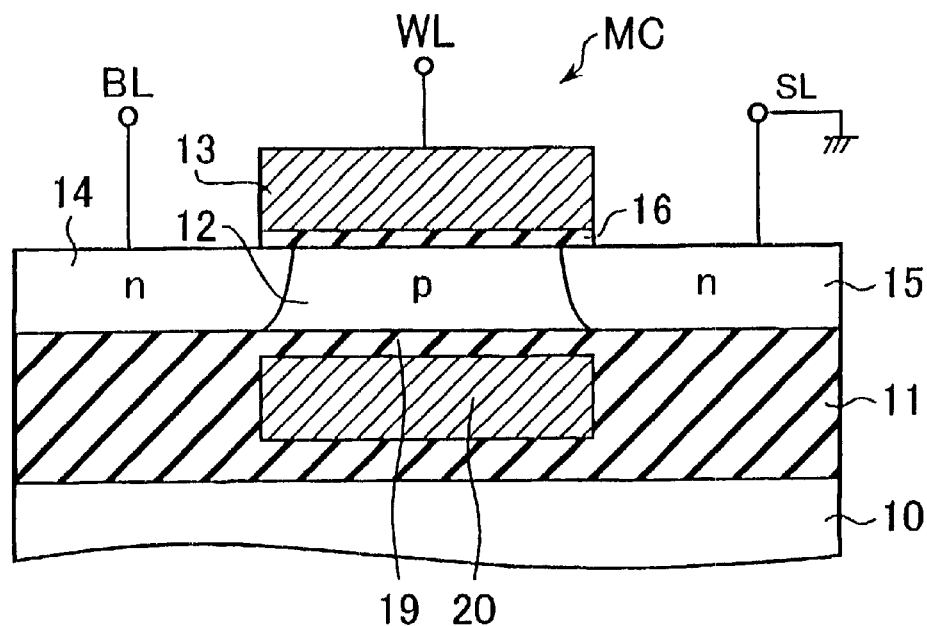
FIG. 26A is a sectional view showing a structure of a DRAM cell according to a third embodiment by contrast with the first embodiment.
Figure 26B:
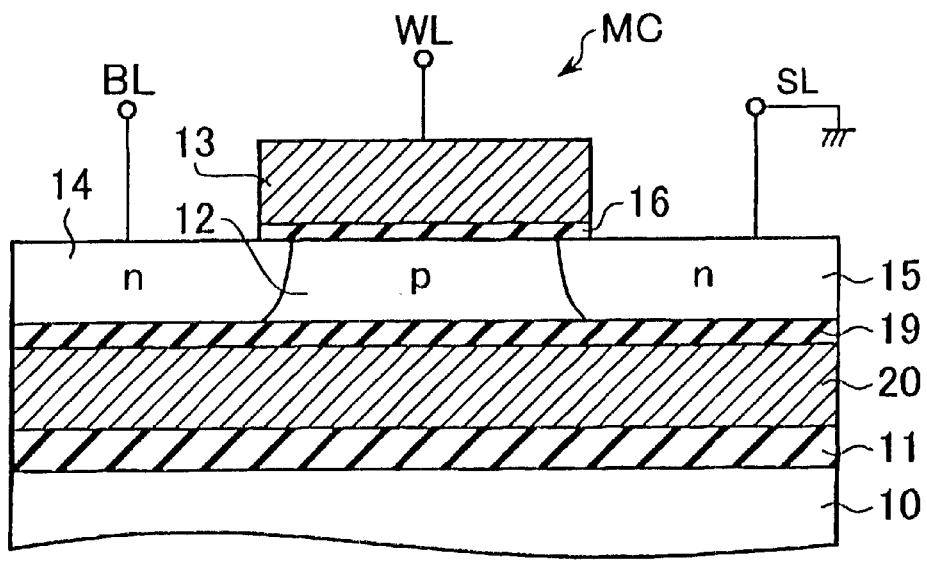
FIG. 26B is a sectional view showing another structure of a DRAM cell according to the third embodiment by contrast with the second embodiment.

FIGS. 26A and 26B show such a DRAM cell structure according to a third embodiment. FIG. 26A corresponds to FIG. 19 of the first embodiment and FIG. 26B corresponds to FIG. 20 of the second embodiment. In the first and second embodiments, the thickness of the gate insulating film 16 at the side of the first gate 13 is substantially equal to the thickness of the gate insulating film 19 at the side of the second gate 20. On the other hand, in this embodiment, the thickness of the gate insulating film 16 at the side of the first gate 13 is 12.5 nm, and the thickness of the gate insulating film 19 at the side of the second gate 20 is 37.5 nm, i.e. that of the gate insulating film 19 is thicker than that of the gate insulating film 16.

Figure 27:
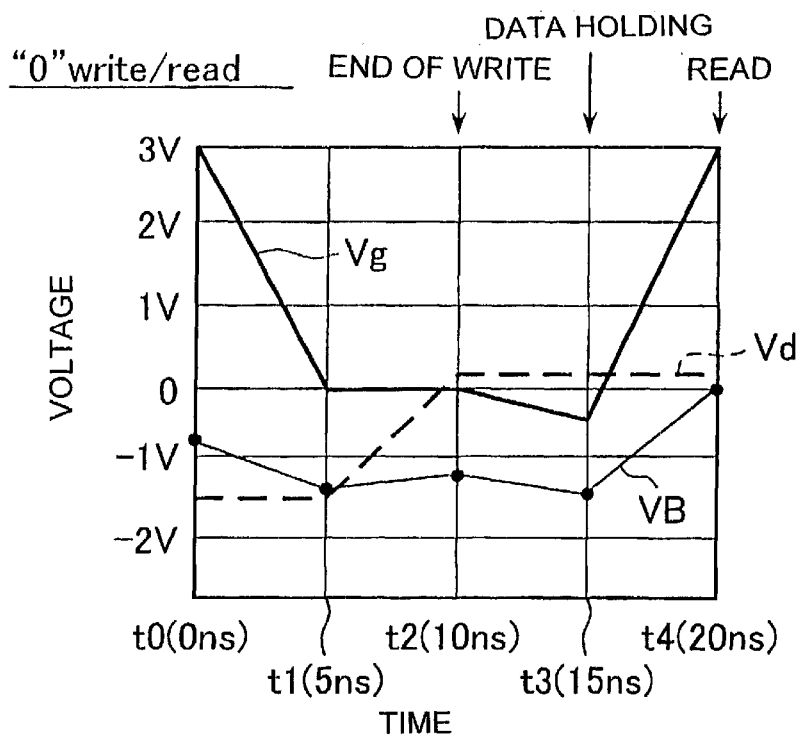
FIG. 27 is a diagram showing a change of a body potential by a simulation of "0" data write/read of the DRAM cell.
Figure 28:
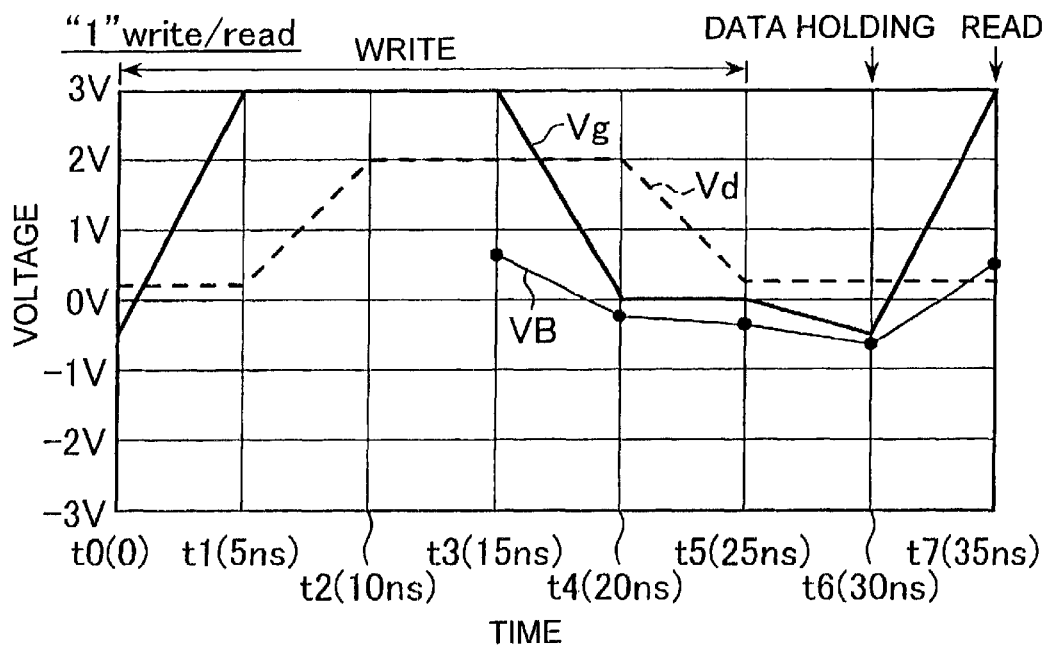
FIG. 28 is a diagram showing a change of body potential by a simulation of "1" data write/read of the DRAM cell.
Figures 29, 30:
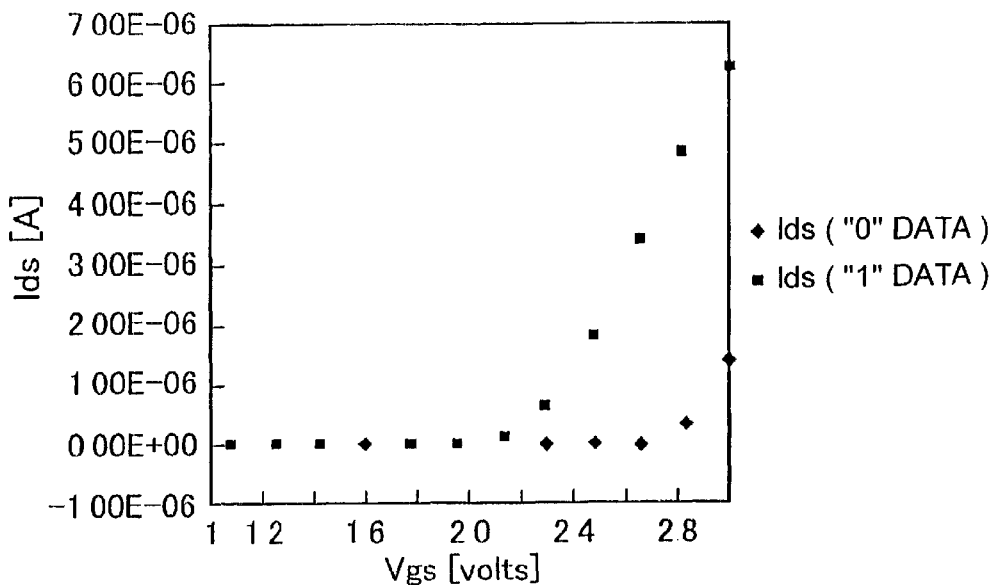
FIG. 29 is a diagram showing characteristics of a drain current versus a gate voltage by the simulation of "0" and "1" data read.
FIG. 30 is a diagram showing a layout of a memory cell array including DRAM cells according to a fourth embodiment.

FIGS. 27 and 28 show a result of a simulation, where the other device conditions are the same as the above-mentioned embodiments. However, the amplitude of the word line voltage (Vg) is different from the above-mentioned embodiments, because the H level during the write operation is 3 V whereas the L level during the data holding state is −0.5 V. FIG. 27 only shows a potential change from immediately after the writing operation. FIG. 29 shows a graph of the drain current Ids versus the gate-source voltage Vgs in the cell form the data holding state to the data read operation.

As shown in FIG. 29, the difference of the threshold voltage between the "0" data and the "1" data is Δth=0.62 V. The difference of the threshold voltage in this embodiment is smaller than that in the above-mentioned embodiments. However, the capacitance at the side of the first gate 13 is relatively larger than that at the side of the second gate 20, so that the same operation can be realized even though the amplitude of the voltage of the word line is reduced. Moreover, it is easily realized to operate the DRAM cell within the limitation of the breakdown voltage of the transistor because of small amplitude of the voltage of the word line.

[Fourth embodiment]

Figure 31:
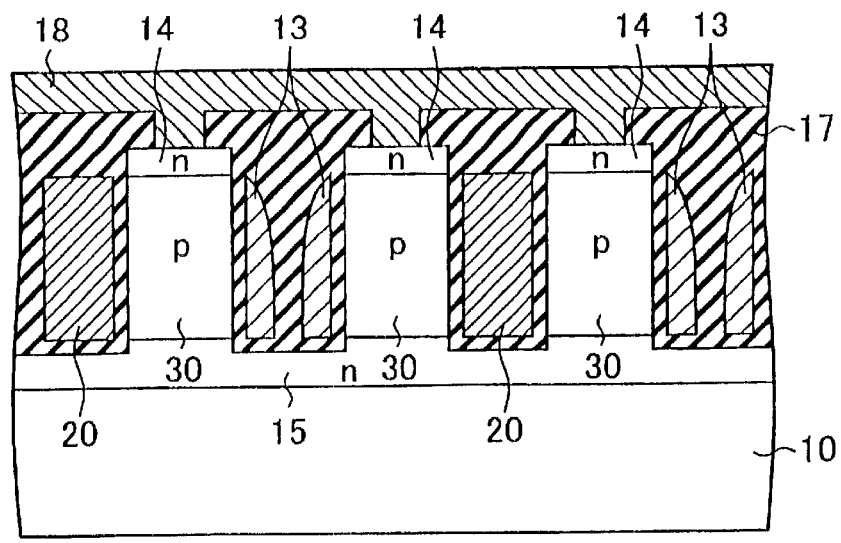
FIG. 31 is a sectional view taken along the line A–A' in FIG. 30.

FIG. 30 shows a layout of a DRAM cell array according to a fourth embodiment, and FIG. 31 shows a sectional view taken along the line A–A' in FIG. 30. In the above-mentioned embodiments, the SOI substrate is used in order to form the transistor having the channel body in the floating state. On the other hand, in this embodiment, a so-called SGT (surrounding gate transistor) structure is used in order to form a DRAM cell having vertical transistors, each of which has the channel body in the floating state.

P-type pillar silicon portions 30 are formed and arranged on the silicon substrate 10 by forming grooves lengthwise and crosswise with RIE. The first gates 13 and the second gates 20 are formed on both side surfaces of each pillar silicon portion 30 to be opposite to each other. As shown in the sectional view of FIG. 31, the first gates 13 and the second gates 20 are alternately embedded between the pillar silicon portions 30. The first gates 13 are formed by means of a side wall remaining technique so that each of the first gates 13 constitutes an independent gate electrode for each of both the pillar silicon portions 30 between the pillar silicon portions 30. On the other hand, the second gates 20 are commonly embedded between the neighboring pillar silicon portions 30. The first gates 13 and the second gates 20 are continuously formed to constitute the first word line WL1 and the second word line WL2, respectively.

The n-type drain diffusion regions 14 are formed on the top surfaces of the pillar silicon portions 30, and then the n-type source diffusion region 15 is formed on the bottom portions of the pillar silicon portions 30. The source diffusion region 15 is shared among all the cells. Thereby, the memory cells MC, which include vertical transistors having the channel bodies in the floating state, are formed. An interlayer dielectric film 17 is formed on the substrate in which the first gates 13 and the second gates 20 are embedded, and then the bit lines 18 are formed thereon.

In this embodiment, the same operation as aforesaid embodiments can be realized by supplying the fixed potential to the second gates 20.

[Fifth embodiment]

Figure 32A:
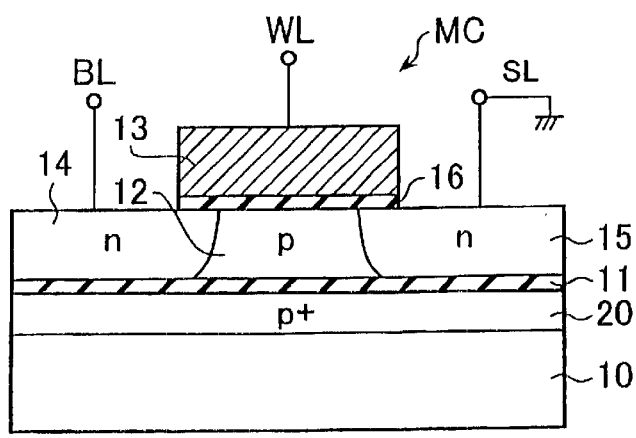
FIG. 32A is a sectional view showing a structure of a DRAM cell according to a fifth embodiment by contrast with the first embodiment.
Figure 32B:
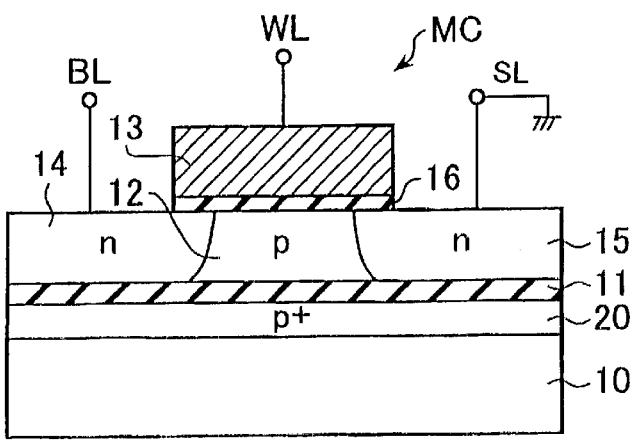
FIG. 32B is a sectional view showing another structure of a DRAM cell according to the fifth embodiment by contrast with the second embodiment.

FIG. 32A shows a DRAM cell structure according to a fifth embodiment by contrast with FIG. 19 of the first embodiment. FIG. 32B shows another DRAM cell structure according to a fifth embodiment by contrast with FIG. 20 of the second embodiment. In this embodiment, the thickness of the silicon oxide film 11 for the isolation is reduced, and then the silicon oxide film 11 is intactly used as a gate insulating film. A $p^+$-type diffusion region of a high concentration is formed on the surface portion at the side of silicon oxide film 11 of the silicon substrate 10, and it serves as the second gate 20.

In the DRAM cell structure shown in FIG. 32A, the thickness of the silicon oxide film 11 is substantially equal to the thickness of the gate insulating film 16. In the DRAM cell structure shown in FIG. 32B, the thickness of the silicon oxide film 11 is thicker than the thickness of the gate insulating film 16.

In this embodiment, the same operation as the above-mentioned embodiments can be realized.

In the embodiments explained above, the first gate 13 is opposite to the second gate 20 via the semiconductor layer. That is, the first gate 13 and second gate 20 are formed above and below the silicon layer 12 in the embodiments of FIGS. 19, 20 and 32, and the first gate 13 and second gate 20 are formed on both sides of the individual pillar silicon portion 30 in the embodiments of FIG. 31. However, an arrangement of these first and second gates 13 and 20 is not limited to these embodiments. For example, not shown in a diagram though, the second gate may be formed in an element isolation region isolating the memory cells crosswise such that the second gate is opposite to the surface which is at right angles to the surface opposite to the first gate.

As described above, according to the embodiments, one memory cell is formed out of one simple transistor having a floating semiconductor layer, so that a small cell size of $4F^2$ can be realized. The source of the transistor is connected to the fixed potential, and then the control of read, rewrite and refresh is performed by means of the only control of the voltage of the bit line connected to the drain and the word line connected to the gate. The second gate opposite to the body region of the transistor is capacitive-coupled with the body region, and then the capacitive coupling ratio of the first gate to the body region is optimized, so that the threshold voltage difference between the "0" and "1" data can be increased.

What is claimed is:

1. A semiconductor memory device having MIS transistors to constitute memory cells, each of the MIS transistors comprising:

a semiconductor layer;

a source region formed in the semiconductor layer;

a drain region formed apart from the source region in the semiconductor layer, the semiconductor layer between the source region and the drain region serving as a body region in a floating state; and a first gate which forms a channel in the body region;

a second gate formed in addition to the first gate, a potential of the second gate being fixed so as to control a potential of the body region by a capacitive coupling;

wherein the MIS transistor has a first data state in which the body region has a first potential set by impact ionization generated near a drain junction and a second data state in which the body region has a second potential set by a forward current flowing through the drain junction.

2. The semiconductor memory device according to claim 1, wherein the first data state is set by the impact ionization generated near the drain junction with a pentode operation of the MIS transistor, and the second data state is set by applying a forward bias between the body region applied a predetermined potential from the first gate by a capacitive coupling and the drain region.

3. The semiconductor memory device according to claim 1, wherein the MIS transistors are arranged in a matrix form to constitute a memory cell array, the drain regions of the MIS transistors along a first direction are connected to a bit line, respectively, the first gates of the MIS transistors along a second direction are connected to a word line, respectively, the source regions of the MIS transistors are connected to a first fixed potential, and the second gates of the MIS transistors are connected to a second fixed potential, wherein, when data is written, with the first fixed potential as a reference voltage, a first control voltage higher than the reference voltage is supplied to a selected word line, a second control voltage lower than the reference voltage is supplied to a non-selected word line, and a third control voltage higher than the reference voltage or a fourth control voltage lower than the reference voltage is supplied to the bit line on the basis of the first data state or the second data state.

4. The semiconductor memory device according to claim 3, wherein the second fixed potential supplied to the second gate is set in order that a surface at the side of the second gate of the body region is in an accumulation state.

5. The semiconductor memory device according to claim 3, wherein the second fixed potential supplied to the second gate is set in order that a surface at the side of the second gate of the body region is in a depletion state.

6. The semiconductor memory device according to claim 3, wherein the second fixed potential supplied to the second gate is set in order to be lower than the reference voltage.

7. The semiconductor memory device according to claim 1, wherein the semiconductor layer is formed on a semiconductor substrate via an insulating film, and the first gate is continuously formed on the semiconductor layer to constitute a word line, and the second gate is continuously formed under the semiconductor layer to constitute a wiring in parallel with the word line.

8. The semiconductor memory device according to claim 7, wherein the second gate is a polysilicon film which is buried in the insulating film and opposite to the semiconductor layer via a gate insulating film.

9. The semiconductor memory device according to claim 7, wherein the thickness of a first gate insulating film between the first gate and the semiconductor layer is substantially equal to the thickness of a second gate insulating film between the second gate and the semiconductor layer.

10. The semiconductor memory device according to claim 7, wherein the thickness of a second gate insulating film between the second gate and the semiconductor layer is thicker than the thickness of a first gate insulating film between the first gate and the semiconductor layer.

11. The semiconductor memory device according to claim 1, wherein the semiconductor layer is formed on a semiconductor substrate via an insulating film, and the first gate is continuously formed on the semiconductor layer to constitute a word line, and the second gate is formed under the semiconductor layer to constitute a common gate shared among all the memory cells.

12. The semiconductor memory device according to claim 11, wherein the second gate is a polysilicon film which is buried in the insulating film and opposite to the semiconductor layer via a gate insulating film.

13. The semiconductor memory device according to claim 11, wherein the thickness of a first gate insulating film between the first gate and the semiconductor layer is substantially equal to the thickness of a second gate insulating film between the second gate and the semiconductor layer.

14. The semiconductor memory device according to claim 11, wherein the thickness of a second gate insulating film between the second gate and the semiconductor layer is thicker than the thickness of a first gate insulating film between the first gate and the semiconductor layer.

15. The semiconductor memory device according to claim 11, wherein the second gate is a high concentration impurity diffusion layer formed on the semiconductor substrate and opposite to the semiconductor layer via the insulating film.

16. The semiconductor memory device according to claim 15, wherein the thickness of a first gate insulating film between the first gate and the semiconductor layer is substantially equal to the thickness of the insulating film between the second gate and the semiconductor layer.

17. The semiconductor memory device according to claim 15, wherein the thickness of the insulating film between the second gate and the semiconductor layer is thicker than the thickness of a first gate insulating film between the first gate and the semiconductor layer.

18. The semiconductor memory device according to claim 1, wherein the semiconductor layer is a pillar semiconductor portion formed on a semiconductor substrate, the first gate and the second gate are formed on both side surfaces of the pillar semiconductor portion so as to be opposite to each other, and the drain region is formed on the top of the pillar semiconductor portion and the source region is formed on the bottom of the pillar semiconductor portion.

19. The semiconductor memory device according to claim 1, wherein the semiconductor layer is formed on a semiconductor substrate via an insulating film, and the first gate is continuously formed on the semiconductor layer to constitute a word line, and the second gate is formed under the semiconductor layer to constitute a common gate shared among the plurality of memory cells.

* * * * *